United States Patent [19]
Shimomura

[11] Patent Number: 6,157,045
[45] Date of Patent: *Dec. 5, 2000

[54] SEMICONDUCTOR DEVICE EVALUATION PATTERN AND EVALUATION METHOD

[75] Inventor: Hiroshi Shimomura, Hirakata, Japan

[73] Assignee: Matsushita Electric Industrial Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/702,176

[22] Filed: Aug. 23, 1996

[30] Foreign Application Priority Data

Aug. 25, 1995 [JP] Japan .................................... 7-217228

[51] Int. Cl.$^7$ .................................................. H01L 23/58
[52] U.S. Cl. ............................ 257/48; 257/528; 257/532; 257/536
[58] Field of Search ............................ 257/48, 528, 532, 257/536; 438/14, 17, 18

[56] References Cited

U.S. PATENT DOCUMENTS

| | | | |
|---|---|---|---|
| 4,573,058 | 2/1986 | Brooks | 346/76 PH |
| 4,969,124 | 11/1990 | Luich et al. | 365/201 |
| 5,057,451 | 10/1991 | McCollum | 437/69 |
| 5,341,049 | 8/1994 | Shimizu et al. | . |
| 5,429,979 | 7/1995 | Lee et al. | 437/52 |
| 5,536,968 | 7/1996 | Crafts et al. | 257/529 |
| 5,625,220 | 4/1997 | Liu et al. | 257/530 |

OTHER PUBLICATIONS

Strait, P.T., A First Course in Probability and Statistics with Applications, Harcourt Brace Johanovich, pp. 443–452, 1983.
Patent Abstracts of Japan, Publication No. 02003945 published Jan. 1990.

*Primary Examiner*—Sara Crane
*Attorney, Agent, or Firm*—Parkhurst & Wendell, L.L.P.

[57] ABSTRACT

An evaluation pattern and an evaluation method of devices capable of measuring with precision the unit capacitance and specific precision of passive devices necessary in analog circuits on a single semiconductor substrate, unit capacitors in such a quantity to overcome the measuring error of measuring instruments, arranged in an array by nx pieces in the X direction (nx being a natural number) and ny pieces in the Y direction (ny being a natural number), are connected by wiring to be capable of measuring the sum of capacitances in each column at least in one of the array directions in the X and Y directions of the unit capacitors.

4 Claims, 7 Drawing Sheets

PRIOR ART

PRIOR ART

SEMICONDUCTOR DEVICE EVALUATION PATTERN AND EVALUATION METHOD

FIELD OF THE INVENTION

The present invention relates to an evaluation pattern and evaluation method of semiconductor devices particularly, in passive devices used in an analog circuit, for enhancing the relative precision of device parameters of high precision for designing, and contributing to high precision design of analog circuits, and thereby realizing high performance, small size, and low power consumption of LSI applied in multimedia appliances and portable appliances, and more particularly relates to an evaluation pattern and evaluation method of semiconductor devices helpful for circuit design, in circuit design of LSI, by creating multiple devices (resistance, capacity, etc.) on a semiconductor substrate in a specific pattern, and analyzing manufacturing fluctuations of devices attributable to manufacturing devices.

BACKGROUND OF THE INVENTION

The LSI for mobile communication and portable information appliances is advanced in digitization of circuitry mainly in the signal processing signal and control circuit. A mixed analog/digital LSI including analog signal processing circuitry for input signals is a key device for realizing small size and low power consumption of appliances. For such high performance, analog circuit design technology of high precision is needed.

For analog circuit design, it is important to understand the precision of devices formed on a semiconductor substrate (transistor, resistor, capacitor, etc.).

On the other hand, in the devices on the semiconductor substrate, there are always manufacturing fluctuations having a specific tendency. As the approach on the LSI manufacturing process side, process parameters for reducing as much as possible such fluctuations due to a manufacturing device are employed. Yet, fluctuations of created devices are not eliminated to zero.

The circuit designer must select circuit parameters having a margin for guaranteeing normal operation, even in a worst case, while understanding the relative precision (parameter precision of two adjacent devices) of the device parameters due to such manufacturing fluctuations (capacitance, resistance, etc.). If the operation margin is too large, the circuit performance is sacrificed. Such being the case, a designer's understanding of accurate device fluctuations leads to higher performance of LSI.

A prior art understanding of such device fluctuations is described by reference to FIG. 9 and FIG. 10 which show an example of capacitors, in particular, as passive devices. FIG. 9 and FIG. 10 show conventional patterns for evaluating the capacitance and capacitor specific precision. In FIG. 9, reference numerals 8 and 9 are unit capacitors having capacity of 50 fF each, 10 and 11 are upper electrode terminals, and 12 is a common GND terminal. In FIG. 10, reference numerals 13 and 14 are unit capacitors having capacity of 10 pF each, 15 and 16 are upper electrode terminals, and 17 is a common GND terminal.

In the conventional evaluation method of capacitor specific precision, as shown in FIG. 9, two independent devices with small capacitance used in an actual circuit (for example, 50 fF: supposing capacity density to be 1 fF/$\mu m^2$, area in 50 $\mu m^2$: approx. 7 $\mu m$ square) are disposed closely to each other, the capacitances are measured, and their difference is calculated to define a specific precision, or, as shown in FIG. 10, such devices of large capacitances as the measuring errors may be ignored (about 10 pF: supposing capacity density to be 1 fF/$\mu m^2$, area is 10000 $\mu m^2$: 100 $\mu m$ square) are disposed closely to each other, and the difference of the capacitances is evaluated, and the specific precision is defined.

These conventional evaluation methods, however, have the following problems.

First, in an actual circuit, capacitors of small individual capacity such as 30 fF or 50 fF are used, and what is required in circuit design is the difference of such proximity capacitances, but in the present capacity measuring instrument of high precision, it is extremely hard to measure the capacitance or the order of even 10 fF at high precision, and the obtained value is concealed by the measuring error, and the meaning of specific precision is practically lost.

Second, the capacitor of about 10 pF which is considered to be measured precisely enough by the existing capacity measuring instrument has an area of 10000 $\mu m^2$, for example, supposing the capacity density to be 1 fF/$\mu m^2$, that is 100 $\mu m$ square. By disposing such unit capacities close to each other, when the difference of the capacitances is determined, a sufficient measuring precision is obtained, while the capacitor specific precision as measured above is not suitable for actual circuit design.

The problems of capacitors are mentioned above, but same problems exist in the evaluation of resistors.

DISCLOSURE OF THE INVENTION

It is hence a primary object of the invention to present an evaluation pattern and evaluation method of devices capable of measuring the capacitance and specific precision precisely in the devices used in actual circuitry in the light of the above problems. To achieve the object, the invention presents a pattern for evaluating semiconductor devices necessary for analog circuit design at high accuracy, and a method of such evaluation.

The means of the invention includes semiconductor devices to be measured which are formed on a semiconductor substrate, in such a quantity as to be permitted to ignore the measuring error of the measuring instrument, by nx pieces in the X direction (nx being a natural number) and ny pieces in the Y direction (ny being a natural number,) each arranged in an array on a same plane, and wiring formed on said semiconductor substrate, for measuring the sum of evaluation values to characterize the performance of the devices to be measured in a column in at least one of the array directions of the X and Y directions of the semiconductor devices to be measured.

According to such an arrangement, it is possible to measure the sum of the evaluation values for characterizing the device performance in the column in at least one of the array directions, or the X and Y directions, of the unit devices to be measured on the same semiconductor substrate, so that the capacitance and specific precision may be measured precisely even in the devices used in actual circuits.

The semiconductor devices to be measured formed on the semiconductor substrate are separated into two section, for the X direction and for the Y direction.

Thus, wiring can be connected for each direction of evaluation, and the wiring can be simplified, and the area occupied by the evaluation pattern can be reduced.

One embodiment of the invention relates to an evaluation method of capacitance for calculating the capacitance of unit capacitors by local capacitance distribution, by dividing the capacitance of each device column by the number of unit capacitors contained in the capacitor column, by using the above described capacity evaluation pattern.

By dividing the capacitance of each device column by the number of unit capacitors contained in the capacitor column, the capacitance of the unit capacitor can be calculated precisely. Hence, evaluation of unit capacitance of high accuracy is realized.

The invention also relates to a method of evaluation of resistance for calculating the resistance of unit resistors, with a resister pattern.

In another embodiment the invention relates to a method of evaluation of specific precision of proximity capacitors comprising the steps of measuring the sum of capacitance in each capacitor clumn, by using the earlier described capacity evaluation pattern, determining a straight line by the method of least squares using the coordinate of capacitor column as a first variable and the capacitance of each device column as a second variable, and calculating the specific precision of capacitors by the inclination of the straight line by the method of least squares.

According to such a method, the capacitance of each device column is measured, the straight line is determined by the method of least squares using the coordinate of capacitor column as a first variable and the capacitance of each device column as a second variable, the inclination between the capacitances of each column is determined from the straight line, and the proximity capacity is calculated from the local capacity distribution, so that the specific precision of proximity capacitors of high accuracy can be calculated in consideration of the process fluctuations and measurement fluctuations.

In still another embodiment the invention relates to a method of evaluation of specific precision of proximity unit resistors of high accuracy for calculating the specific precision of resistors, using a resistor pattern to be measured. In this method, too, the specific precision of precision capacitors of high accuracy can be calculated.

EMBODIMENTS

Figure 1:
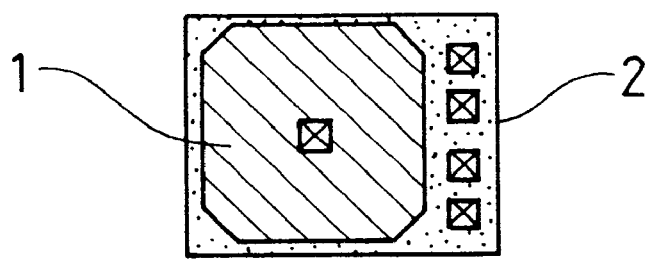
FIG. 1 is a plan view of a unit capacitor in an embodiment of the invention.

Referring now to the drawings, an evaluation pattern and evaluation method of semiconductor devices in an embodiment of the invention is described below.

In this embodiment, the semiconductor unit devices to be measured are capacitors, but not limited to the capacitors alone; the embodiment can be similarly applied in others such as resistors. In this embodiment, the capacity may be regarded as the evaluation value for characterizing the performance of the capacitor.

The embodiment is described below while referring to an example of a capacitor between two layers of polysilicon as a capacitor. FIG. 1 is a plan view of a unit capacity block of a capacitors between two layers of polysilicon, FIG. 2 is a sectional view of the unit capacity block of capacitors between two layers of polysilicon, and FIG. 3 shows an evaluation pattern of unit capacitance and capacitor specific precision.

Figure 2:
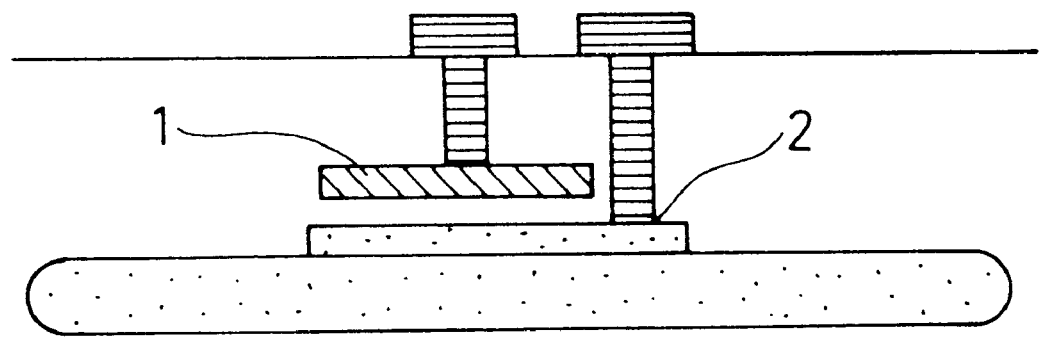
FIG. 2 is a sectional view of the unit capacitor in the embodiment of the invention.
Figure 3:
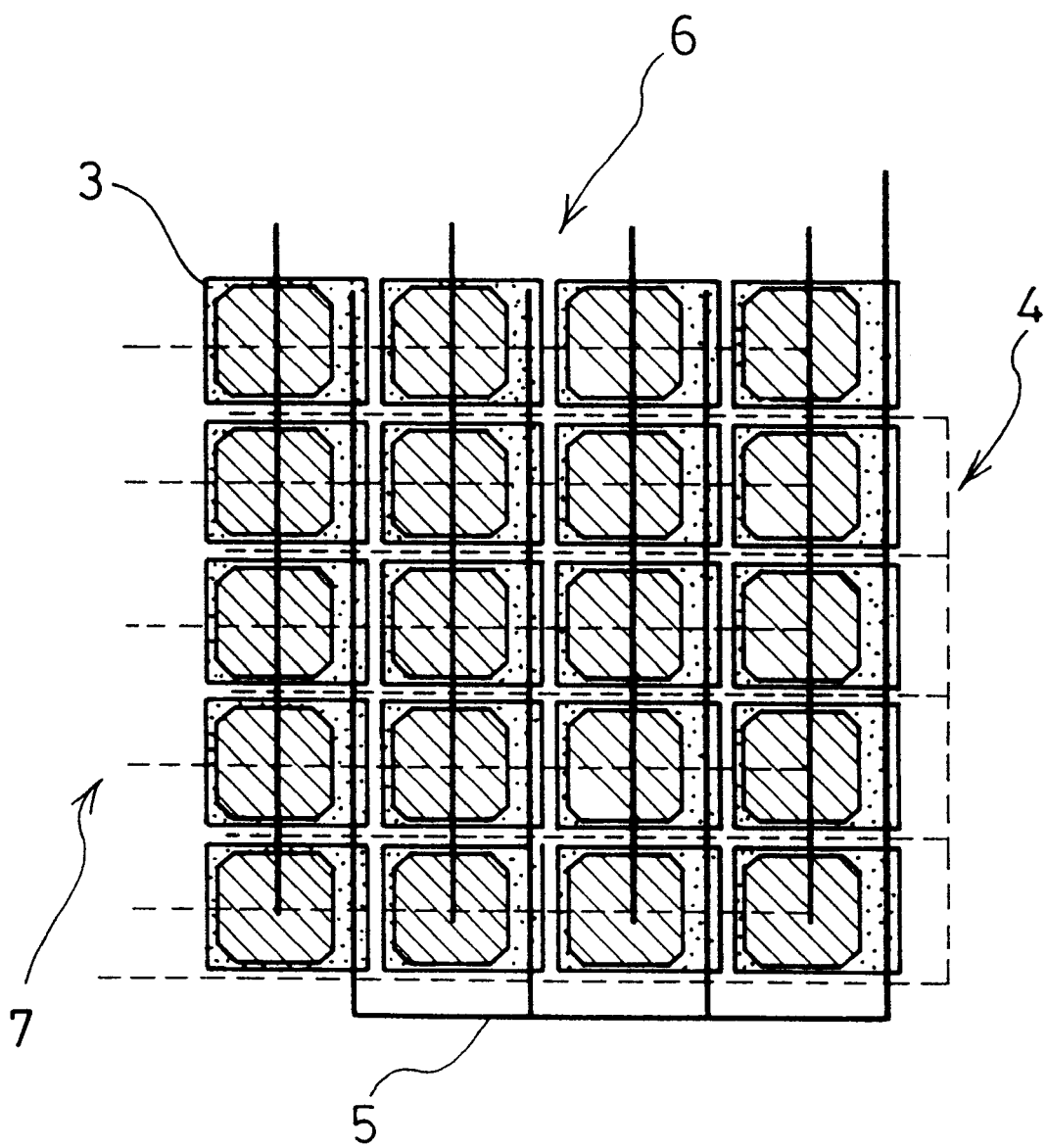
FIG. 3 is a plan view of a capacitor pattern in the embodiment of the invention.

In FIG. 1 and FIG. 2, reference numeral 1 is a capacitor upper electrode, and 2 is a capacitor lower electrode. Or, as shown in FIG. 3, unit capacitors 3 are arranged in an array on a same plane, by nx pieces in the x direction (four pieces in FIG. 3 for the sake of simplicity), and ny pieces in the Y direction (five pieces in FIG. 3 for the sake of simplicity). These unit capacitors 3 are connected by second layer wiring 4 and first layer wiring 5 so as to be capable of measuring the sum of capacitances of the columns in each array direction of X direction and Y direction of unit capacitors 3. Herein, it is required to dispose by a sufficient quantity so that the sum of capacitances of the capacitor column 7 or 6 in the X direction or Y direction may obtain a sufficient measurement (for example, 10 pf) for ignoring the measuring error of the existing capacity measuring instruments. For example, to evaluate the capacitance of unit capacity of 100 fF and capacitor specific precision, it is necessary to dispose at least 100 pieces in an array in the X direction and Y direction each.

Figure 4:
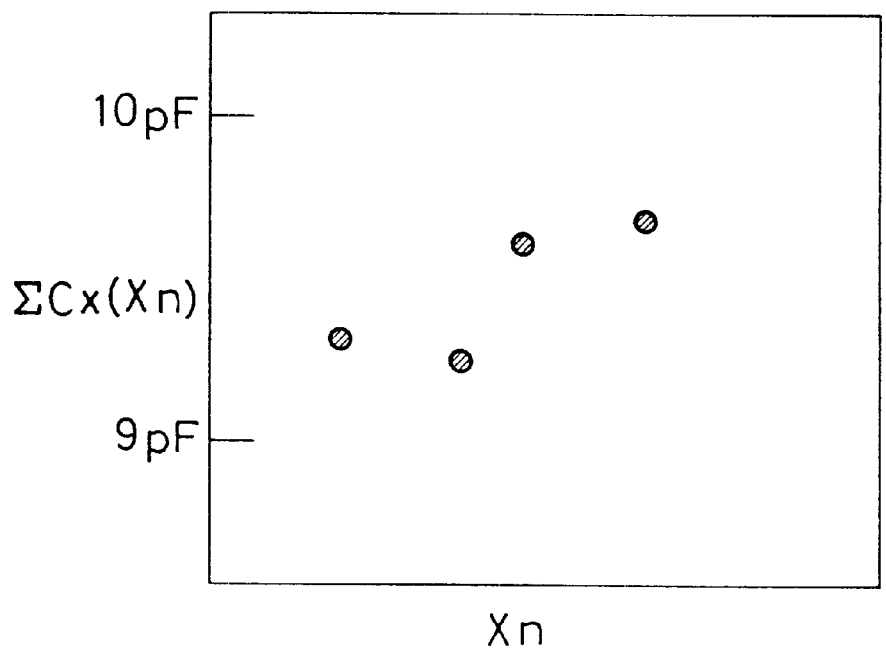
FIG. 4 is an explanatory diagram showing the average capacitance of the capacitors in the embodiment of the invention.
Figure 5:
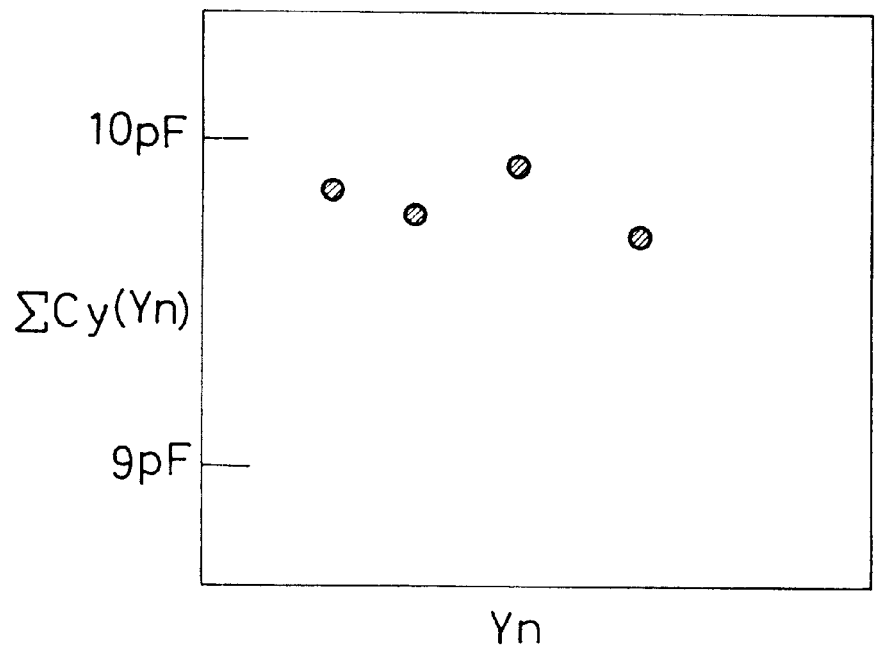
FIG. 5 is an explanatory diagram showing the average capacitance of the capacitors in the embodiment of the invention.

Relating then to an example of capacitors between two layers of polysilicon, the method of measuring the unit capacitance by using the pattern of evaluation shown in FIG. 3 and evaluating the capacitor specific precision is described by reference to FIG. 4 and FIG. 5.

In the following formula expressing Cxav, ny is the number of devices in the Y direction, Cxr is a capacitance of the device at a position of x in the X direction and r in the Y direction, and Cxav is the average capacitance in the X direction.

$$Cxav = \frac{1}{ny}\sum_{r=1}^{n} Cxr$$

Similarly, in the following formula expressing Cyav, nx is the number of devices in the X direction, Cyr is the capacitance of the device at a position of y in the Y direction and r in the X direction, and Cyav is the average capacitance in the Y direction.

$$Cyav = \frac{1}{nx}\sum_{r=1}^{n} Cyr$$

By using the capacity evaluation pattern in the constitution shown in FIG. 3, the capacitance of each one of capacitor column 7, 6 in the X or Y direction is measured. As the measured value, as mentioned above, a sufficiently large value enough to ignore the measuring error of the existing capacity measuring instrumentation is obtained. By dividing this measured value by the number of unit capacitors contained in the capacitor column, the average capacitance of unit capacity is evaluated.

In the invention, since the capacitance of the unit capacitors is thus calculated by the local capacity distribution, it is possible to evaluate the unit capacitance with high accuracy in consideration of the process fluctuations, and the absolute capacity can be evaluated by measuring the unit capacitance of each obtained chip on the entire surface of wafer.

Figure 6:
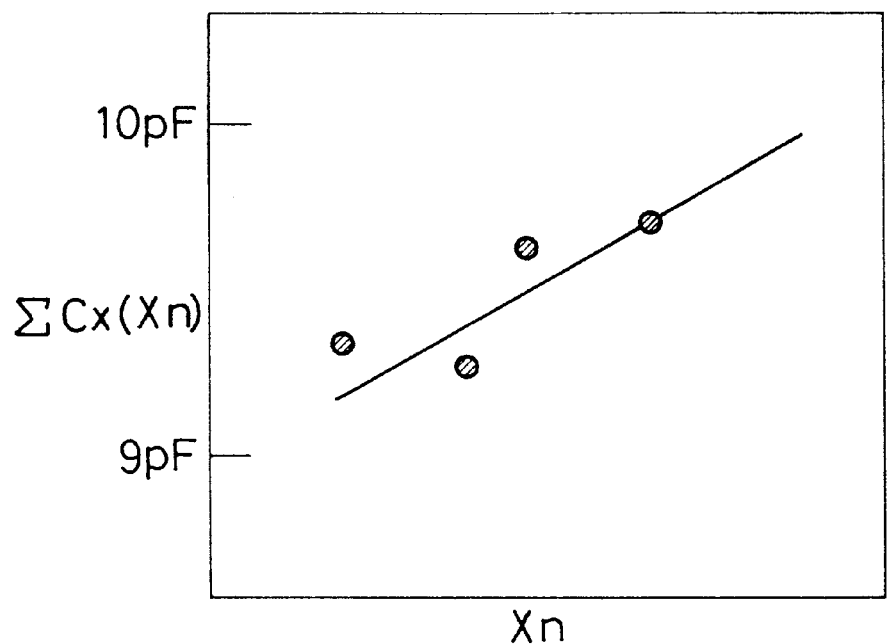
FIG. 6 is an explanatory diagram showing the capacitor specific precision of the capacitors in the embodiment of the invention.
Figure 7:
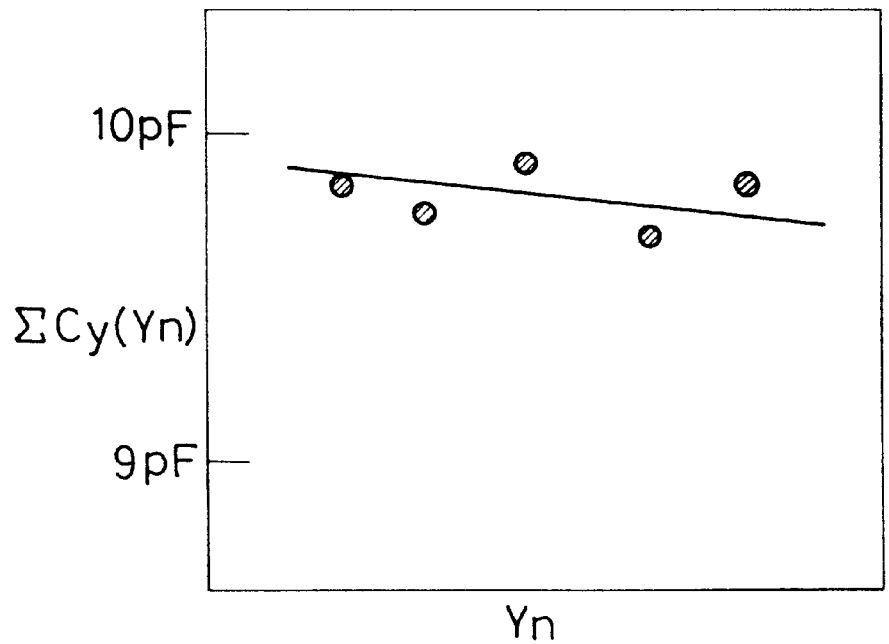
FIG. 7 is an explanatory diagram showing the capacitor specific precision of the capacitors in the embodiment of the invention.

Similarly, an example of capacitors between two layers of a polysilicon is explained in FIG. 6 and FIG. 7, regarding the method of evaluating the specific precision of capacitors by using the evaluation pattern shown in FIG. 3.

By the capacity evaluation pattern in the constitution shown in FIG. 3, first, the sum of capacitances in each capacitor column 7, 6 in the X direction and Y direction is measured. The measured value is, as mentioned above, large enough for ignoring the measuring error. Consequently, a straight line is determined by the method of least squares, using the coordinate of capacitor column as first variable and capacitance of each capacitor column being measured as second variable, and the inclination of the straight line determined by the method of least squares is defined as the capacitor specific precision.

In the invention, since the proximity capacity is calculated from the local capacity distribution by determining the inclination between the capacitances of each capacitor column as mentioned above, it is possible to evaluate the capacitor specific precision of high accuracy in consideration of process fluctuations.

A second embodiment is described below.

FIGS. 8(a) and 8(b) are schematic diagrams of capacitor patterns according to the second embodiment. In the first embodiment, the unit capacitors 3 are arranged by nx pieces in the X direction and ny pieces in the Y direction, in an array, forming a rectangle on the whole. These unit capacitors 3 are connected at first layer wiring 5 and second layer wiring 4, so that the capacity sum of the capacitor columns 7, 6 may be measured in each array direction of X direction and Y direction of the unit device capacities 3.

By contrast, in the second embodiment, the unit capacitors 3 are formed on the semiconductor substrate, separately for the X direction and for the Y direction.

Figure 8:
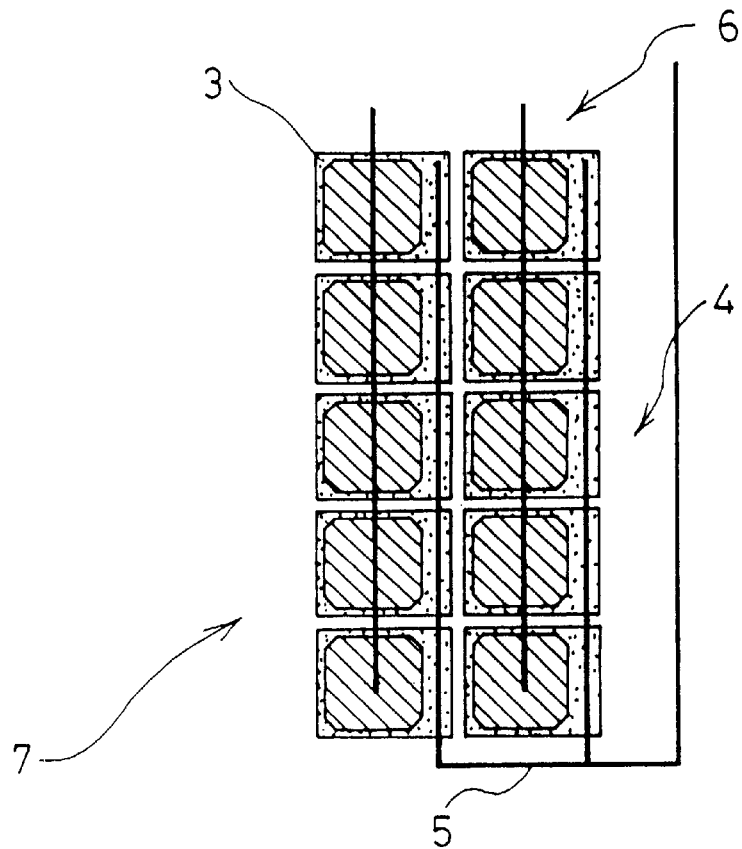
FIGS. 8a and 8b are plan views of a capacitor pattern in another embodiment of the invention.
Figure 8:
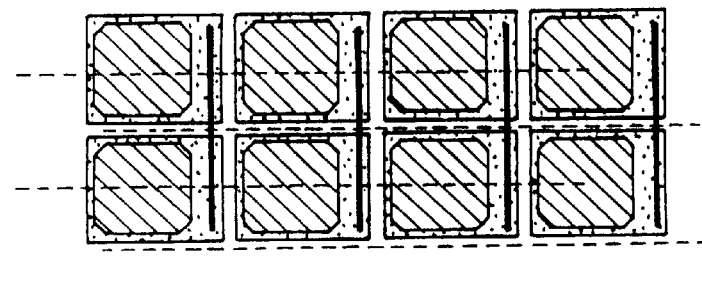
Figure 9:
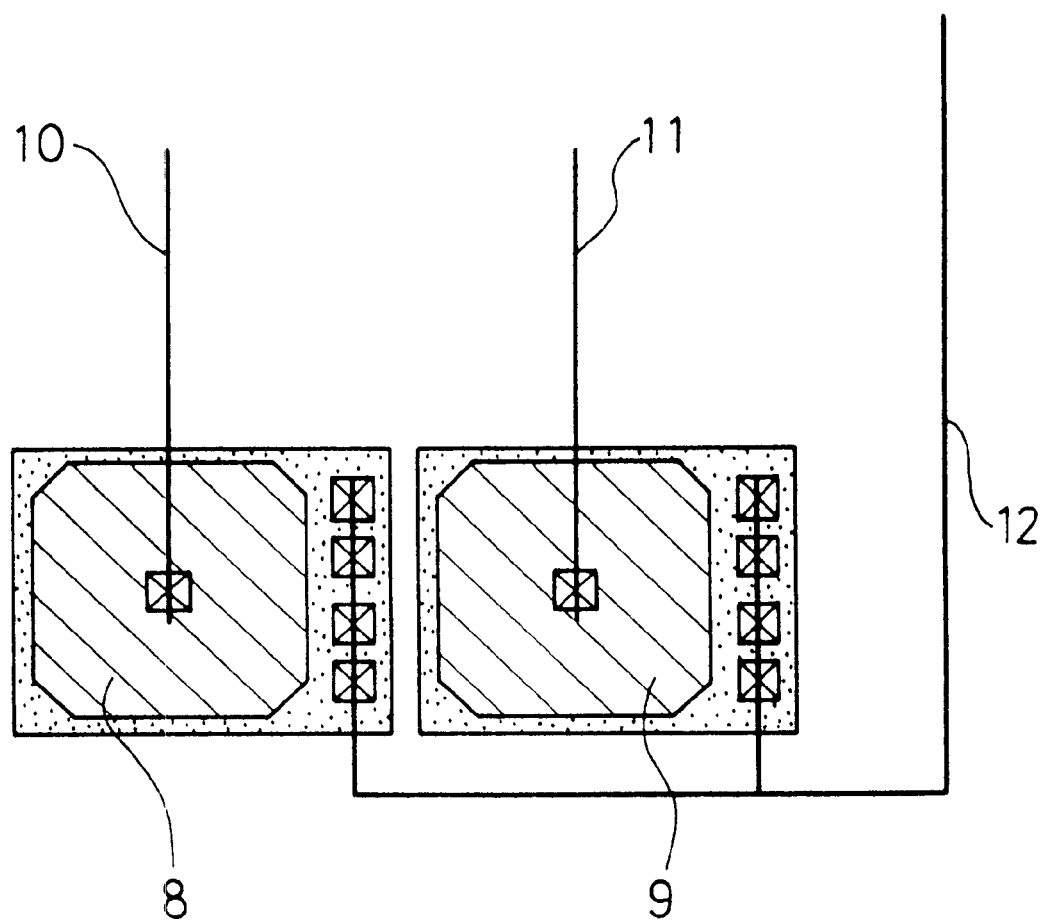
FIG. 9 is a schematic diagram of a conventional capacitor pattern.
Figure 10:
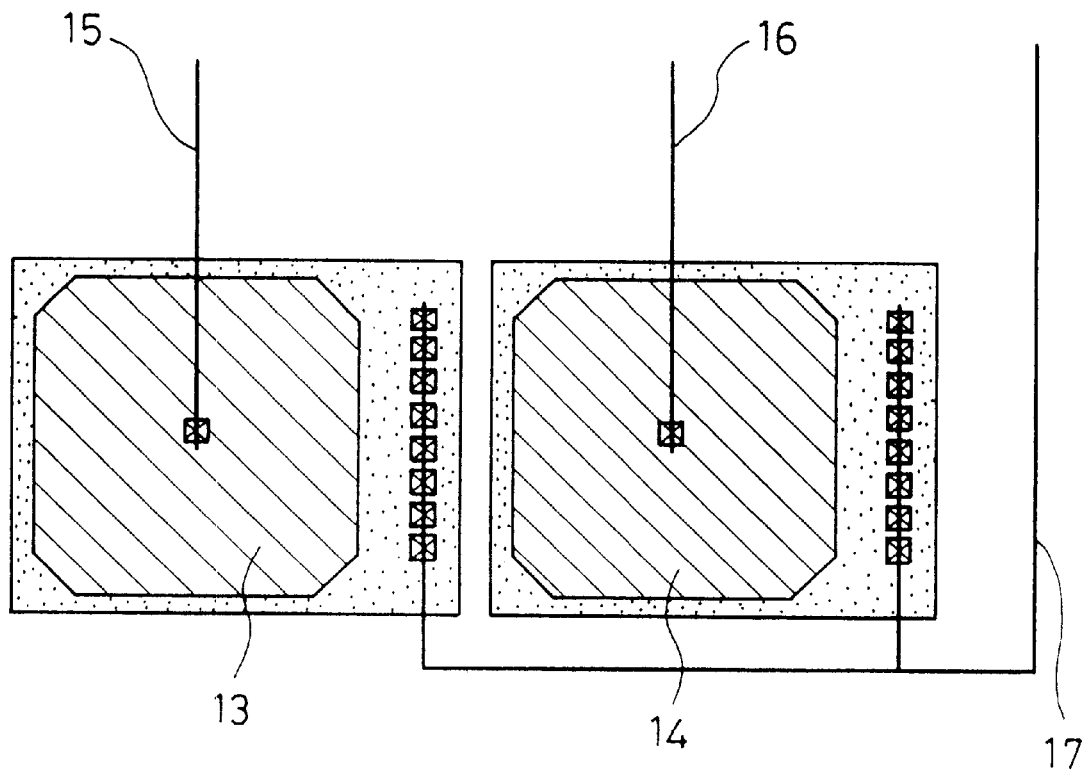
FIG. 10 a schematic diagram of another conventional capacitor pattern.

For example, when evaluating the capacitance and capacitor specific precision of unit capacity of 100 fF in the X direction, the patterns must be arranged at least by 100 pieces in an array in the X direction, but in the Y direction it is only necessary that the quantity be enough for assuring necessary samples (two pieces in FIG. 8). In such patterns in the second constitution, wiring may be connected individually for each evaluation direction, the wiring may be simplified and the area occupied by evaluation patterns may be reduced.

What is claimed is:

1. A semiconductor device evaluation pattern for multiple devices disposed on a semiconductor substrate and analyzing manufacturing fluctuations attributable to manufacturing devices, comprising:

multiple semiconductor devices to be measured each having a same configuration, area and function, and formed on a same plane of a semiconductor substrate, said devices being arranged in an array in two directions such that nx pieces are aligned linearly in the X-direction, nx being a natural number, and ny pieces that are aligned in the Y-direction, ny being a natural number; and wiring formed on said semiconductor substrate, for measuring the sum of evaluation values to characterize the performance of the devices to be measured in a column in at least one of the array directions in the X and Y directions of the semiconductor devices to be measured, wherein the semiconductor devices to be measured are one of capacitors and resistors, and the evaluation values to characterize the semiconductor device performance are the individual unit capacitance and proximity capacitor relative precision or the individual unit resistance and proximity resistor relative precision.

2. A semiconductor device evaluation pattern as set forth in claim 1, wherein the semiconductor devices to be measured are one of capacitors and resistors, and the evaluation values to characterize the semiconductor device performance are the individual unit capacitance and proximity capacitor relative precision or the individual unit resistance and proximity resistor relative precision.

3. A semiconductor device evaluation method for creating multiple capacitors on a semiconductor substrate in a prescribed pattern and analyzing manufacturing fluctuations attributable to manufacturing devices, said method being employed in designing an analog circuit, said method comprising the steps of:

forming multiple capacitors to be measured each having a same configuration, area and function on a same plane of a semiconductor substrate, said capacitors being arranged in an array in two directions such that nx pieces are aligned linearly in the X-direction, nx being a natural number, and ny pieces are aligned in the Y-direction, ny being a natural number, so that although a value of each unit capacitor is unmeasurable due to a measuring error associated with a current measuring instrument, the measuring error of the current measuring instrument can be ignored when measuring the sum of values of the capacitors aligned in the X or Y directions;

measuring the sum of capacitances of said unit capacitors in a column in at least one of the array directions in the X and Y directions;

determining a straight line by the method of least squares, using the coordinate of the column as a first variable and the capacitance of each device column as a second variable; and calculating the capacitor relative precision by the inclination of the straight line by the method of least squares.

4. A semiconductor device evaluation method for creating multiple resistors on a semiconductor substrate in a prescribed pattern and analyzing manufacturing fluctuations attributable to manufacturing devices, said method being employed in designing an analog circuit, said method comprising the steps of:

forming multiple resistors to be measured each having a same configuration, area and function on a same plane of a semiconductor substrate, said resistors being arranged in an array in two directions such that nx pieces are aligned linearly in the X-direction, nx being a natural number, and ny pieces are aligned in the Y-direction, ny being a natural number, so that although a value of each unit capacitor is unmeasurable due to a measuring error associated with a current measuring instrument, the measuring error of the current measuring instrument can be ignored when measuring the sum of values of the capacitors aligned in the X or Y directions;

measuring the sum of resistances of said unit resistors in a column in at least one of the array directions in the X and Y directions;

determining a straight line by the method of least squares, using the coordinate of the column as a first variable and the resistance of each device column as a second variable; and calculating the resistor relative precision by the inclination of the straight line by the method of least squares.

* * * * *